(12) United States Patent
Takeda

(10) Patent No.: US 6,188,603 B1
(45) Date of Patent: Feb. 13, 2001

(54) NONVOLATILE MEMORY DEVICE

(75) Inventor: Masaki Takeda, Kanagawa (JP)

(73) Assignee: NEC Corporation, Tokyo (JP)

( * ) Notice: Under 35 U.S.C. 154(b), the term of this patent shall be extended for 0 days.

(21) Appl. No.: 09/161,674

(22) Filed: Sep. 29, 1998

(30) Foreign Application Priority Data

Sep. 29, 1997 (JP) .................................................. 9-263424

(51) Int. Cl.$^7$ .................................................. G11C 16/06
(52) U.S. Cl. .......................... 365/185.09; 365/185.04; 365/185.11; 365/200; 365/201
(58) Field of Search ..................... 365/185.09, 185.04, 365/185.11, 200, 201

(56) References Cited

U.S. PATENT DOCUMENTS

| | | | |
|---|---|---|---|
| 4,680,736 | * 7/1987 | Schrenk | 365/218 |
| 4,780,855 | * 10/1988 | Iida et al. | 365/230 |
| 5,200,923 | * 4/1993 | Sekiguchi | 365/201 |
| 5,226,015 | * 7/1993 | Gotou et al. | 365/230.01 |
| 5,539,699 | * 7/1996 | Sato et al. | 365/201 |
| 5,712,815 | * 1/1998 | Bill et al. | 365/185.03 |

FOREIGN PATENT DOCUMENTS 7-254290   10/1995   (JP) .

* cited by examiner

Primary Examiner—David Nelms
Assistant Examiner—Connie C. Yoha
(74) Attorney, Agent, or Firm—McGinn & Gibb, P.C.

(57) ABSTRACT

A nonvolatile semiconductor memory device includes a memory cell array and a check memory cell array. Each check memory cell is connected to a cell block including a plurality of memory cells and has about the same characteristic as the memory cell. A predetermined value is written to the check memory cell each time data is written to the corresponding cell block. By comparing a value stored in the check memory element to the predetermined value, the deterioration state of the memory cells is detected.

10 Claims, 8 Drawing Sheets

TIMING CONTROLLER

NONVOLATILE MEMORY DEVICE

BACKGROUND OF THE INVENTION

1. Field of the Invention

The present invention relates to a semiconductor memory device which is electrically writable and has a nonvolatile property.

2. Description of the Prior Art

There is, for example, a nonvolatile semiconductor memory device that stores information by storing charges in a floating gate formed on a silicon substrate. Writing of information is realized by heightening a threshold value with respect to a control gate by storing charges in the floating gate, and erasion of information is realized by removing the charges from the floating gate.

The nonvolatile semiconductor memory device of this type has a phenomenon that the device is gradually deteriorated every time erasing/writing is conducted, and it is eventually impossible to do erasing or writing. The details will be described taking an EEPROM (electrically erasable programmable ROM) as an example.

FIG. 8 shows a change in minimum period of time required for erasing/writing when the EEPROM erasing/writing is repeated. As the erasing/writing is repeated, a period of time required for erasing/writing increases. In FIG. 8 is shown evaluation results of plural samples in which diffusion conditions are changed, and as is apparent from the figure, the number of times of writable operation largely changes according to the fluctuation at a manufacturing process.

For that reason, the limited number of times of writing operation is set taking the evaluation of the samples into account, and the operation is ensured within the limited number of times. The abnormal operation of erasing/writing causes information within the memory to be destroyed. Therefore, the lifetime is conventionally judged as described hereinafter.

To detect the lifetime of the nonvolatile semiconductor memory, the memory device is provided with a counter memory for holding the number of times of writing operation for every block which is a minimum unit that conducts writing and a counter for counting the number of times of writing operation and updating the counter memory using the count. An alarm signal is generated when the number of times of writing operation exceeds a predetermined number of times. Such a memory device is disclosed in Japanese Patent Application Laid-Open No. 7-254290.

More specifically, the operation is such that when data is written in a certain block, erasion is first made on all of memory cells within the block to set the contents of the memory cells at 0. Then, writing is made on only the memory cells the contents of which should be set at 1 within the block and the counter corresponding to the written block is incremented by 1. When the number of times of writing operation corresponding to any block exceeds a predetermined number of times. The alarm signal is generated to notify a user that the memory cell reaches its lifetime.

In the above-described method of setting the limited number of times of writing operation, the limited number of times of writing operation is found out by the evaluation of a product. And, when the limited number of times of writing operation reaches a given number of times of writing operation, it is judged that the memory device is at the end of its life.

Accordingly, there is developed a first problem because the lifetime is judged across the board according to not a deterioration state but a predetermined number of times of writing operation. In the case of setting the number of times of writing operation at a given limited value, it is judged that the memory cells can be used no longer regardless of the fact that the memory cells yet sufficiently functions. Since the memory cells have some fluctuation in manufacturing depending on manufacturing rods, the limited value of the number of times of writing operation must comply with the worst conditions. As a result, it is impossible to use the memory cells according to the characteristic thereof.

A second problem is to require a surplus memory, that is, the counter memory for holding the number of times of writing operation for each block. For example, in the case of counting up to 100,000 times, 17 memory cells (17 bits) are necessary for each block of the counter memory.

SUMMARY OF THE INVENTION

The present invention has been made in view of the above circumstances, and therefore an object of the present invention is to provide a nonvolatile semiconductor memory device which can detect a deterioration state of the nonvolatile semiconductor memory with reliability and precision.

According to an aspect of the present invention, a nonvolatile memory device is comprised of a first nonvolatile memory element that is electrically writable and a second nonvolatile memory element that is electrically writable and has about the same characteristic as the first nonvolatile memory element. A memory controller controls write/read operation of the second nonvolatile memory element such that a predetermined value is written to the second nonvolatile memory element each time a write operation is performed in the first nonvolatile memory element. A comparator compares a value stored in the second nonvolatile memory element to the predetermined value.

The second nonvolatile memory element can be used to detect the actual deterioration state of the first nonvolatile memory element according to the characteristics of the nonvolatile memory elements. Therefore, the memory device can be used in suitability with the characteristics of the respective memory elements in comparison with the conventional method in which the number of times of the writing operation is fixed.

Further, the deteriorated state of the second nonvolatile memory element is equal to the worst deteriorated state of the first nonvolatile memory element, or the second nonvolatile memory element is more deteriorated than the first nonvolatile memory element.

According to another aspect of the present invention, a nonvolatile memory device is comprised of a first memory cell array including a predetermined number of cell blocks each including a plurality of first nonvolatile memory cells each being electrically writable and a second memory cell array including the predetermined number of second nonvolatile memory cells each of which is electrically writable and has about the same characteristics as the first nonvolatile memory cell, wherein the second nonvolatile memory cells correspond to the cell blocks, respectively. Further, a first memory controller controls write/read operation of a designated cell block of the first memory cell array, and a second memory controller controls write/read operation of a second nonvolatile memory cell corresponding to the designated cell block such that a predetermined value is written to the second nonvolatile memory cell each time a write operation is performed in the designated cell block. A comparator compares a value stored in the second nonvolatile memory cell to the predetermined value.

Therefore, it is sufficient to provide one memory cell for each cell block. The deterioration state of the corresponding cell block can be judged by detecting the state of the one cell in the second memory.

BRIEF DESCRIPTION OF THE DRAWINGS

These and other objects, features and advantages of this invention will become more fully apparent from the following detailed description taken with the accompanying drawings in which:

FIG. 8A is a characteristic diagram showing a change of the erasing speed of the memory cell as time goes by; and FIG. 8B is a characteristic diagram showing a change of the writing speed of the memory cell as time goes by.

DESCRIPTION OF THE PREFERRED EMBODIMENTS

Now, a description will be given in more details of preferred embodiments of the present invention with reference to the accompanying drawings.

FIRST EMBODIMENT

Figure 1:
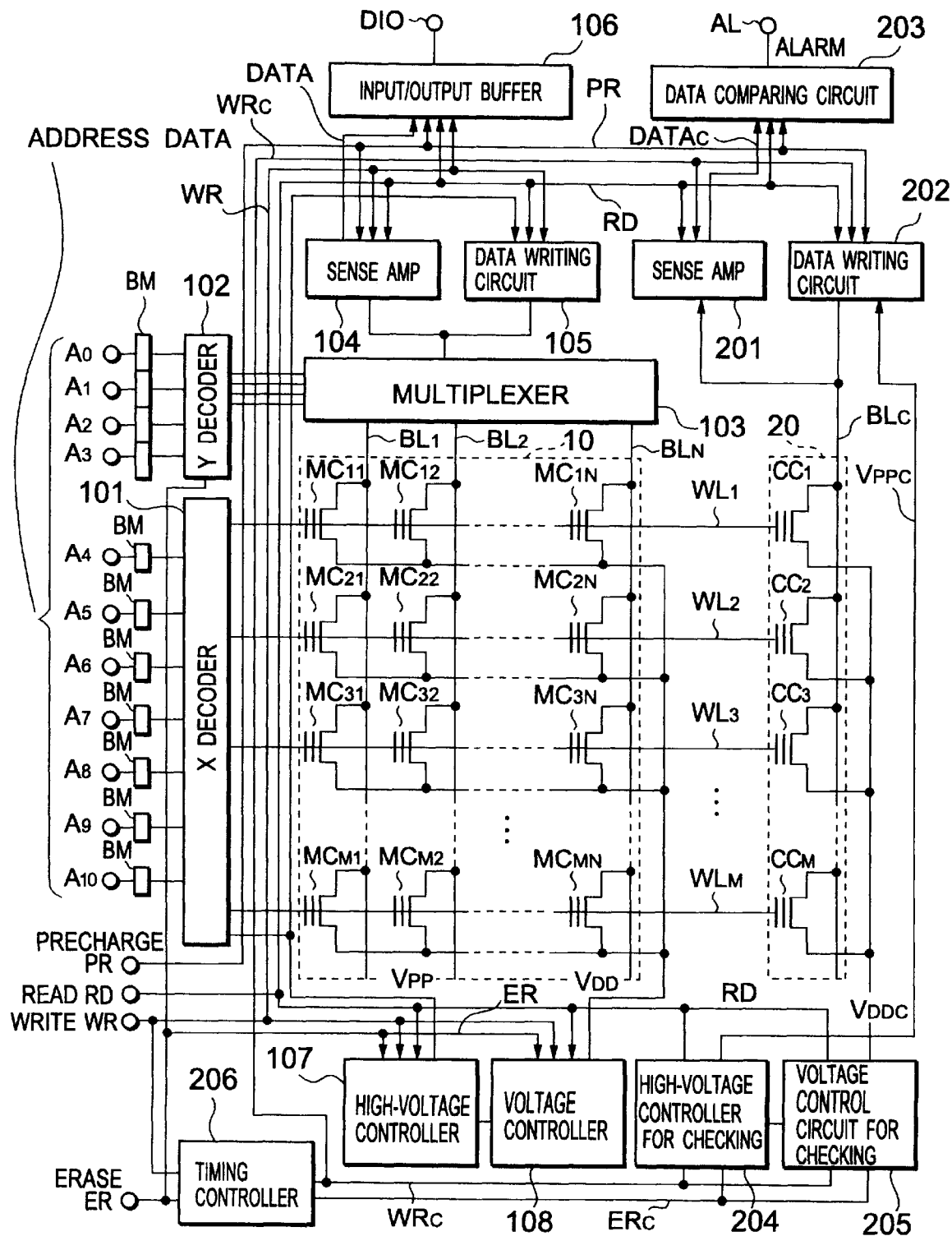
FIG. 1 is a circuit diagram showing a nonvolatile semiconductor memory device in accordance with a first embodiment of the present invention.

Referring FIG. 1, an EEPROM includes a memory cell array 10 and a check memory array 20. The memory cell array 10 is comprised of M×N memory cells $MC_{11}$ to $MC_{MN}$, and the check memory array 20 is comprised of M check memory cells $CC_1$ to $CC_M$ which are used to detect deterioration states. The memory cells an the check memory cells may be a floating-gate semiconductor memory cell.

Access to any memory cell is made according to address data A0–A10. An X decoder 101 inputs the address data bits A4 to A10 through the respective address buffers BM, and the decoder 101 brings one of word lines $WL_1$ to $WL_M$ in a selected state and other word lines in a non-selected state according to address A4–A10. The word lines $WL_1$ to $WL_M$ are connected to M Cell blocks $MC_{11}$–$MC_{1N}$, $MC_{21}$–$MC_{2N}$, . . . , $MC_{M1}$–$MC_{MN}$, respectively. More specifically, the control gates of the memory cells for each cell block are connected in common to the corresponding work line.

The address bits A0 to A3 are inputted to a Y decoder 102 through the respective address buffers BMs. The Y decoder 102 is connected to a multiplexer 103. The multiplexer 103 brings one of bit lines $BL_1$ to $BL_N$ in a selected state according to the output of said Y decoder 102 and other bit lines in a non-selected state.

The control gates of the check memory cells $CC_1$ to $CC_M$ of the check memory array 20 are connected to the word lines $WL_1$ to $WL_M$, respectively. In other words, the check memory cells $CC_1$ to $CC_M$ are provided for each block.

The multiplexer 103 connects a selected one of bit lines $BL_1$ to $BL_N$ to a sense amplifier 104 and a data writing circuit 105. The sense amplifier 104 outputs read data DATA to an input/output buffer 106 in accordance with a precharge signal PR, a write signal WR and a read signal RD. The data write circuit 105 inputs a voltage Vpp and outputs a predetermined voltage to the multiplexer 103 in accordance with the write signal WR and the read signal RD.

A high-voltage controller 107 applies the voltage Vpp to the data write circuit 105 in accordance with the read signal RD, the write signal WR and an erase signal ER. A voltage controller 108 similarly applied a voltage $V_{DD}$ to the memory cells $MC_{11}$ to $MC_{MN}$ in accordance with the read signal RD, the write signal WR and the erase signal ER.

A bit line $BL_c$ connected to the check memory array 20 is connected to the sense amplifier 201 and a data write circuit 202, respectively. The sense amplifier 201 outputs check read data DATAc to a data comparing circuit 203 in accordance with the check write signal WRc and the read signal RD. The data write circuit 202 inputs a check voltage Vppc and outputs a predetermined voltage to the bit line $BL_c$ in accordance with the check write signal WRc and the read signal RD.

A check high-voltage controller 204 applies the check voltage Vppc to the data write circuit 202 in accordance with the read signal RD, the check write signal WRc and the check erase signal ERc. A check voltage controller 205 applies a read voltage $V_{DDC}$ to the check memory cells $CC_1$ to $CC_M$ in accordance with the read signal RD, the check write signal WRc and the check erase signal, ERc, similarly.

In addition, a timing controller 206 inputs the erase signal ER and the write signal WR to made timing adjustment, and produces the check write signal WRc and check erase signal ERc as described above.

The memory device according to the present invention judges the deterioration of the memory cells $MC_{11}$ to $MC_{MN}$ in blocks, using the check memory cells $CC_1$ to $CC_M$.

For example, when the word line $WL_1$ is selected, a first cell block consisting of the memory cells $MC_{11}$ to $MC_{1N}$ is brought in the selected state, and the check memory cell $CC_1$ is also brought in the selected state. When the first cell block is erased, the check memory cell $CC_1$ is also erased at the same time, and all the contents become 0. Also, when data is written in the first cell block, writing operation is made on only the memory cell that changes in state from 0 to 1. However, the writing operation is always made on the check memory cell $CC_1$. Accordingly, in the case where 0 is written in all of cells of the first cell block, no writing operation is conducted on all of the cells, but in this case, 1 must be written in the check memory cell $CC_1$. With this arrangement, since the most number of times of erasing/writing operation is made by the check memory cell $CC_1$ in which 1 is always written among the memory cells on the word line $WL_1$, the check memory cell $CC_1$ is the cell with the most severe use conditions.

When data is read from any cell of the first cell block, data in the check money cell $CC_1$ is read at the same time, and the deterioration state is detected by checking whether 1 is held in the cell contents, or not. The same is applied to other cell blocks and check memory cells corresponding to those cell blocks.

With this operation, the check memory cell is most deteriorated on the same word line, and even in the case where the memory cell array 10 and the check memory array 20 are made equal to each other in the erasing/writing conditions, the deterioration state can be confirmed by the check memory array 20.

In the case where there is a memory cell in which 1 is always written in every writing operation in the memory cells $MC_{11}$ to $MC_{MN}$, the memory cell becomes to be equal to the check memory cell on the same word line in deterioration advanced degree. In this case, the writing condition for the check memory cell may be set to be severe than the writing condition for the memory cell. The erasing/writing conditions will be described later.

DATA WRITING OPERATION

The data writing operation will be described taking as an example the case where writing is made on the first cell block consisting of the memory cells $MC_{11}$ to $MC_{1N}$.

First, data written in the first cell block is erased. Upon inputting an erase signal ER, the contents held in the memory cells $MC_{11}$ to $MC_{1N}$ are erased, and the check memory cell $CC_1$ is also erased at the same time.

Subsequently, data is written. Since all of the memory cells $MC_{11}$ to $MC_{1N}$ of the first cell block are 0, the writing operation is conducted on only the memory cells which should change in state from 0 to 1. The write signal WR causes data to be written in the first cell block. The data write circuit 202 is set so that 1 is always written in the check memory cell $CC_1$. The erasing/writing conditions are controlled by the timing controller 206 as will be described below.

Figure 2A:
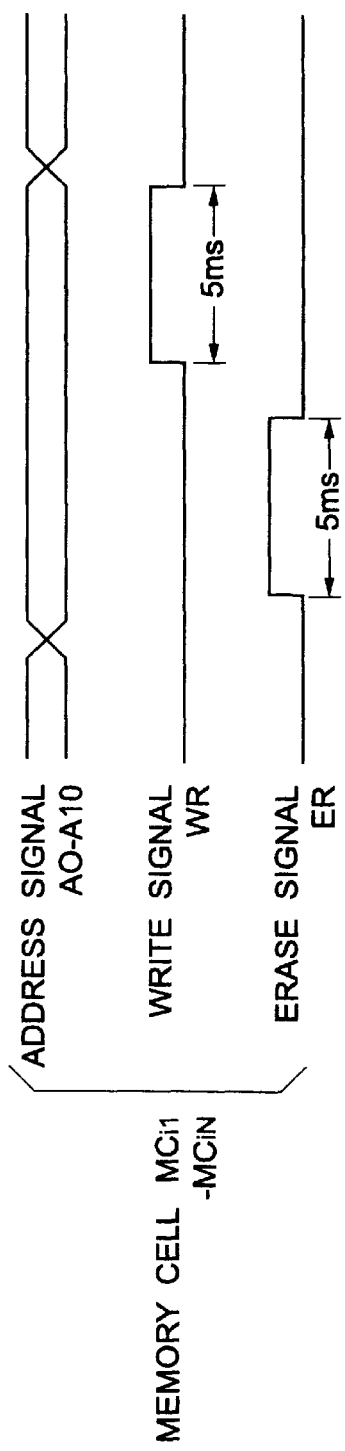
FIG. 2A is a timing waveform chart when erasing/writing is conducted on a memory cell.
Figure 2B:
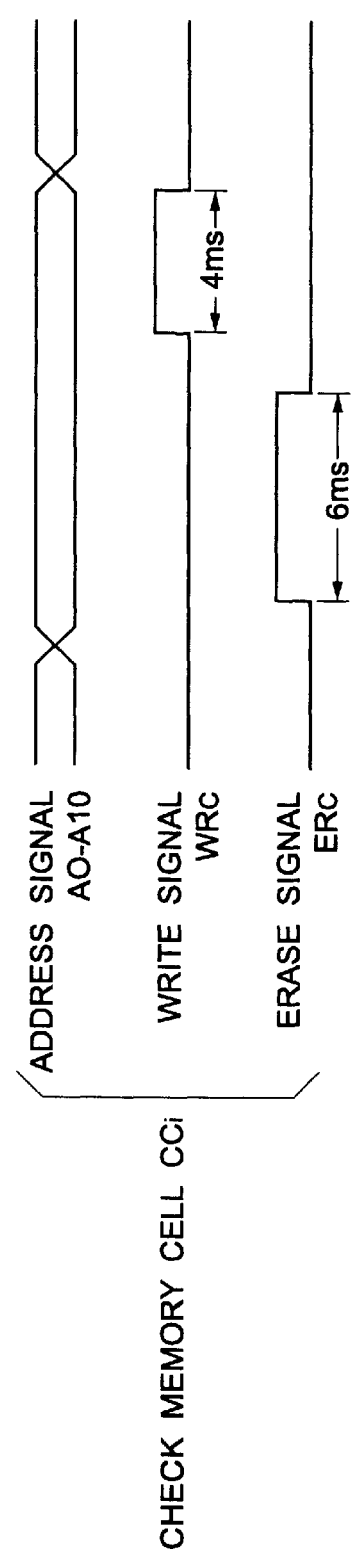
FIG. 2B is a timing waveform chart when erasing/writing is conducted on a check memory cell.

Referring to FIGS. 2A and 2B, when an address is designated, the contents of the memory cells $MC_{i1}$ to $MC_{iN}$ and corresponding check memory cell $CC_i$ in the designated cell block are erased, and thereafter writing operation is made. More, specifically, the erasing operation is conducted on the memory cells $MC_{i1}$ to $MC_{iN}$ in accordance with the erase signal ER of 5-msec pulse width and also on the check memory cell $CC_i$ in accordance with the erase signal ERc of 6-msec width. Subsequently, the writing operation is conducted on the memory cells $MC_{i1}$ to $MC_{iN}$ in accordance with the write signal WR of 5-msec width and also on the check memory cell $CC_i$ in accordance with the write signal WRc of 4-msec width.

In this manner, the severe writing condition can be placed on only the check memory cell $CC_i$ with the same erasing/writing period of time (10 msec). Since the memory cell and the check memory cell have the same characteristic of deterioration, the writing operation cannot be made on the check memory cell with a severe deterioration in writing condition before the memory cell. The timing controller 206 as will be described later performs such an erasing/writing control.

DATA READING OPERATION

The reading operation is made not in blocks but by designating an address. For example, in the case of reading the data of an address belonging to the first cell block, data written in the corresponding check memory cell is read through the sense amplifier 201, and the data comparing circuit 203 generates an alarm signal when the read data is not 1. When the writing operation cannot be normally made on the check memory cell, the deterioration of the main memory 10 is also very advanced, and it is easy to presume the termination of the lifetime.

ERASING/WRITING TIMING CONTROL

Figure 3:
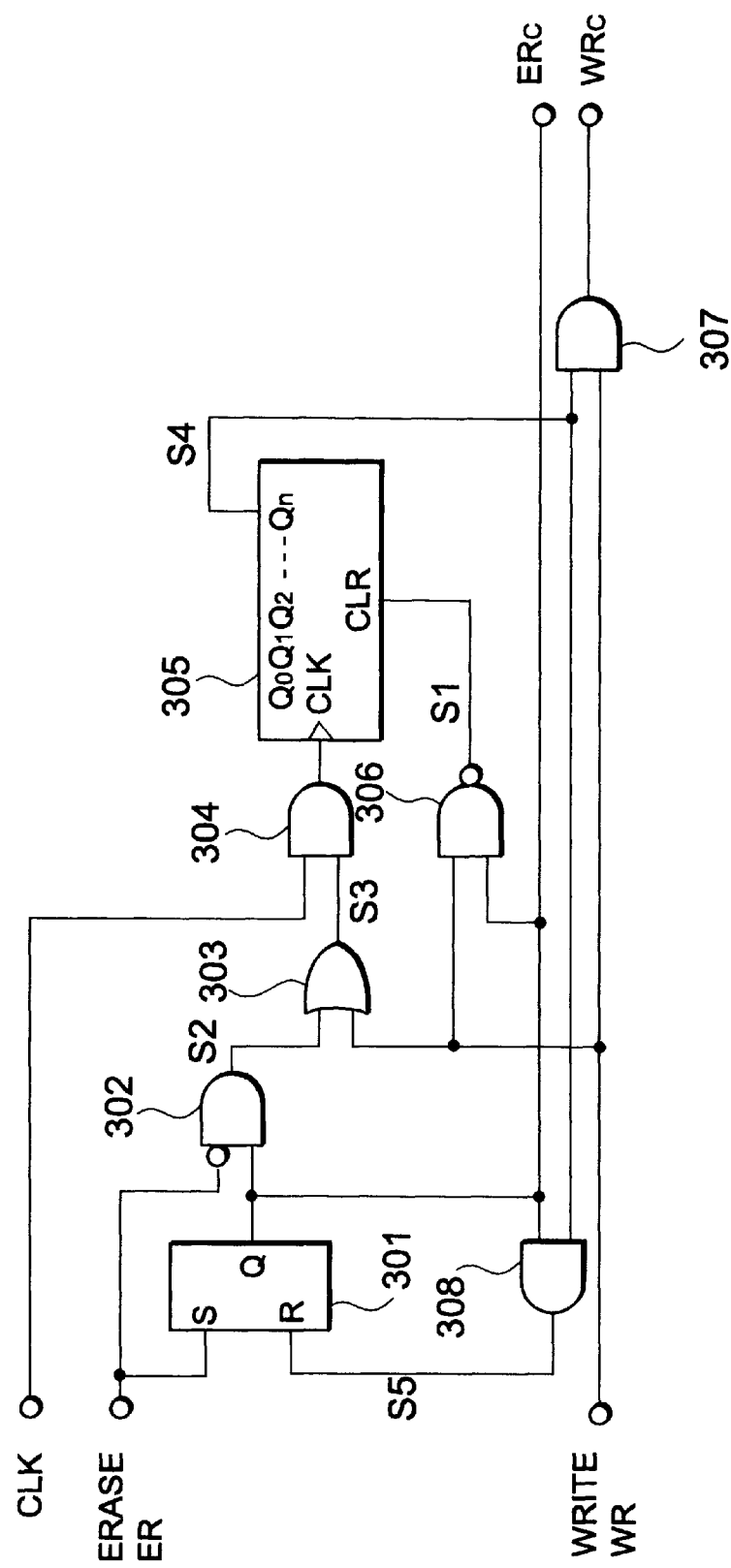
FIG. 3 is a circuit diagram of a timing controller of the first embodiment as shown in FIG. 1.

Referring to FIG. 3, the timing controller 206 inputs the erase signal ER and the write signal WR to produce the check write signal WRc and check erase signal ERc. The erase signal ER is input to the set terminal of a flip-flop circuit 301 and an inverted input terminal of an AND gate 302. The AND gate 302 inputs the output of the flip-flop circuit 301 at the other input terminal thereof to produce an output signal S2. An OR gate 303 inputs the signal S2 from the AND gate 302 and the write signal WR to produce an output signal S3.

A clock signal CLK and the signal S3 are input to an AND gate 304 which produce a clock signal for operating a counter 305. An NAND gate 306 inputs the write signal WR and the output of the flip-flop circuit 301 to produce a reset signal S1 which is output to the clear terminal of the counter 305. The Qn signal S4 of the counter 305 is output to AND gates 307 and 308 when a predetermined time-out period has elapsed. The AND gate 307 inputs the write signal WR and the signal S4 to produce the check write signal WRc. The AND gate 308 inputs the signal S4 and the output signal of the flip-flop circuit 301 to produce a signal S5 which is output to the reset terminal of the flip-flop circuit 301.

Figure 4:
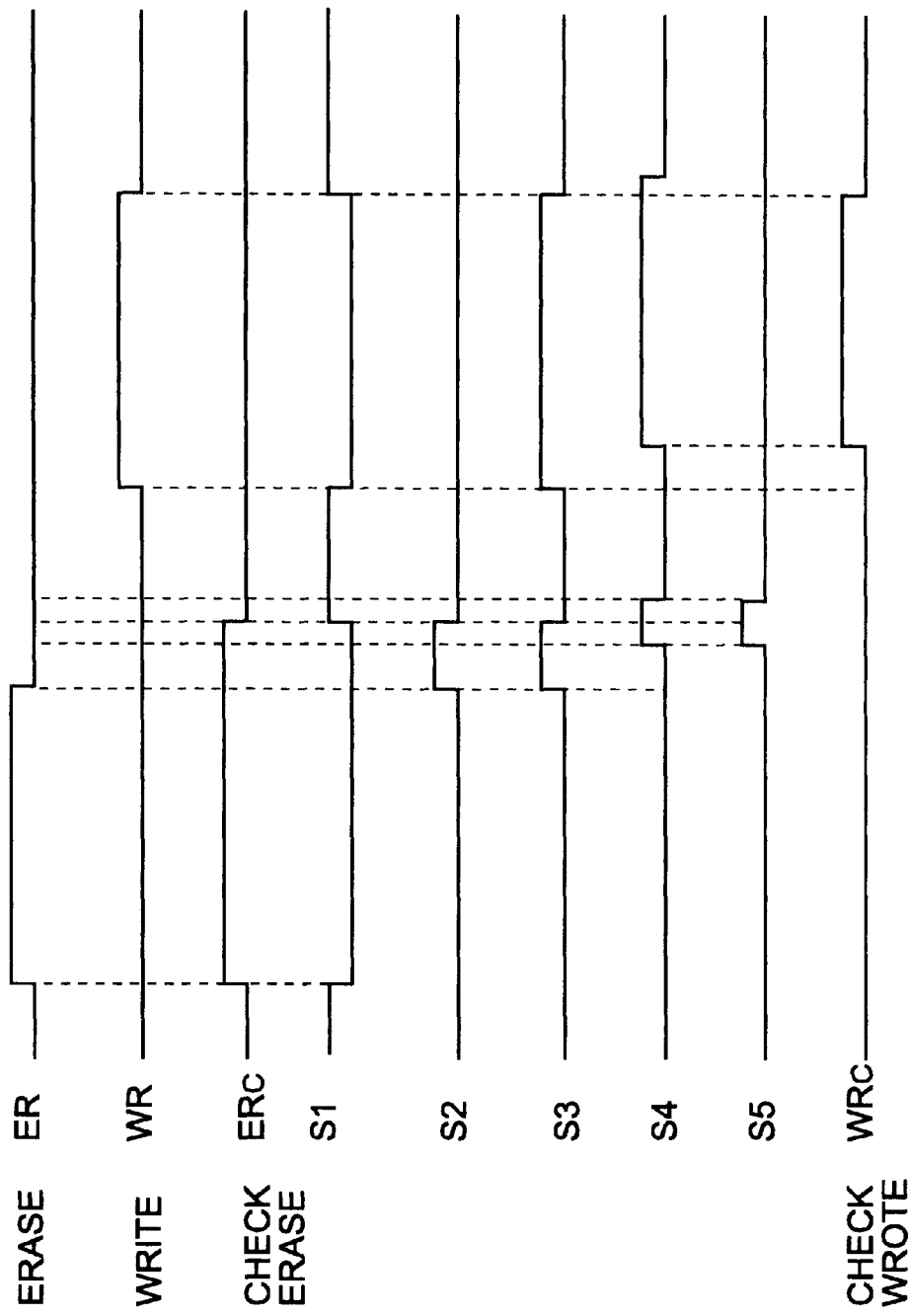
FIG. 4 is a timing waveform chart showing an operation of the timing controller as shown in FIG. 3.

As shown in FIG. 4, when the erase signal ER goes high, the flip-flop circuit 301 changes to the SET state, resulting in the check erase signal ERc going high. Since the signals S2 and S3 are both low, the clock signal CLK is not supplied to the counter 305.

When the erase signal ER falls, the signal S2 and S3 go high and thereby the counter 305 starts counting according to the clock signal CLK. When the counter 305 reaches the predetermined count value, that is, the predetermined time-out period has elapsed, the signal S4 goes high. Therefore, the reset signal S5 goes high and thereby the flip-flop circuit 301 is reset, which causes the check erase signal ERc to go low. In other words, the pulse width of the check erase signal ERc is longer than that of the erase signal ER by the predetermined time-out period to which the counter 305 has been set. In the case as shown in FIGS. 2A and 2B, the predetermined time-out period is 1 msec.

Subsequently, when the write signal WR goes high, the signal S3 goes high and thereby the counter 305 starts counting according to the clock signal CLK. Since the signal S4 at this time remains low, the check write signal WRc is also low. When the counter 305 reaches the predetermined count value, the signal S4 goes high, resulting in the check write signal WRc going high. When the write signal WR goes low, the check write signal WRc also goes low. Therefore, the pulse width of the check write signal WRc is shorter than that of the write signal WR by the predetermined time-out period to which the counter 305 has been set.

CHECK DATA COMPARISON

Figure 5:
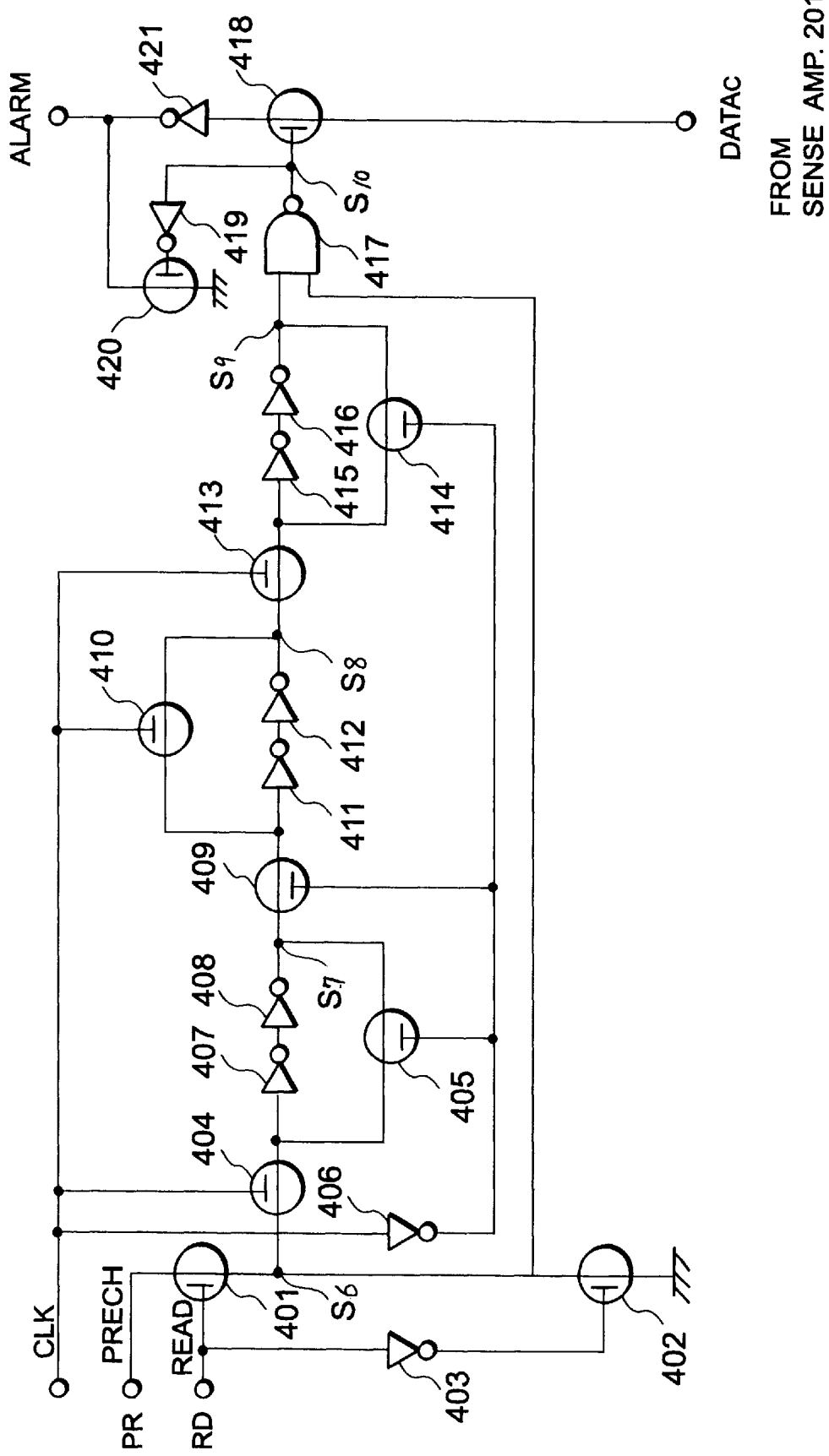
FIG. 5 is a circuit diagram showing a data comparing circuit of the first embodiment as shown in FIG. 1.

Referring to FIG. 5, the data comparing circuit 203 inputs the check data DATAc from the corresponding check memory cell through the sense amplifier 201 and checks to see whether the check data DATAc has the expected value ("1") according to the pre-charge signal PR and the read signal RD. When the read data DATAc is not 1, the data comparing circuit 203 generates the alarm signal.

The read signal RD is applied to the gate of a switching transistor 401 and the inverted read signal by an inverter 403 is also applied to the gate of a switching transistor 402. When the read signal RD is 1, the switching transistor 401 is in on state and the switching transistor 402 is in off state. In this case, the pre-charge signal PR is applied as a signal S6 to an input terminal of an NAND gate 417.

The clock signal CLK is applied to gates of switching transistors 404, 410 and 413. The inverted clock signal by an inverter 406 is applied to gates of switching transistors 405, 409 and 414.

The signal S6 passes through the switching transistor 404 when it is forced into conduction and is input to inverters 407 and 408 connected in series and the switching transistor 405 connected to the inverters 407 and 408 in parallel. The output signal S7 of the inverter 408 is input to the switching transistor 409.

The signal S7 passes through the switching transistor 409 when it is formed into conduction and is input to inverters 411 and 412 connected in series and the switching transistor 413 connected to the inverters 411 and 412 in parallel. The output signal S8 of the inverter 412 is input to the switching transistor 413.

The signal S8 passes through the switching transistor 413 when it is forced into conduction and is input to inverters 415 and 416 connected in series and the switching transistor 414 connected to the inverters 415 and 416 in parallel. The output signal S9 of the inverter 416 is input to the other input terminal of the NAND gate 417.

The output signal S10 of the NAND gate 417 is applied to the gate of a switching transistor 418 and is inverted by an inverter 419. The inverted signal is applied to the gate of a switching transistor 420. When the switching transistor 418 is in the on state, the read data DATAc from the sense amplifier 201 passes through the switching transistor 418 and is inverted by an inverter 421. Therefore, if the predetermined value 1 fails to be written to the check memory cell, resulting in the read data DATAc being 0, then the alarm signal becomes 1.

The pre-charge signal PR is input only while the read signal RD is 1 and the switching transistor 401 is on, and the check data DATAc is read from the check memory cell at the designated address when the pre-charge signal PR falls.

Figure 6:
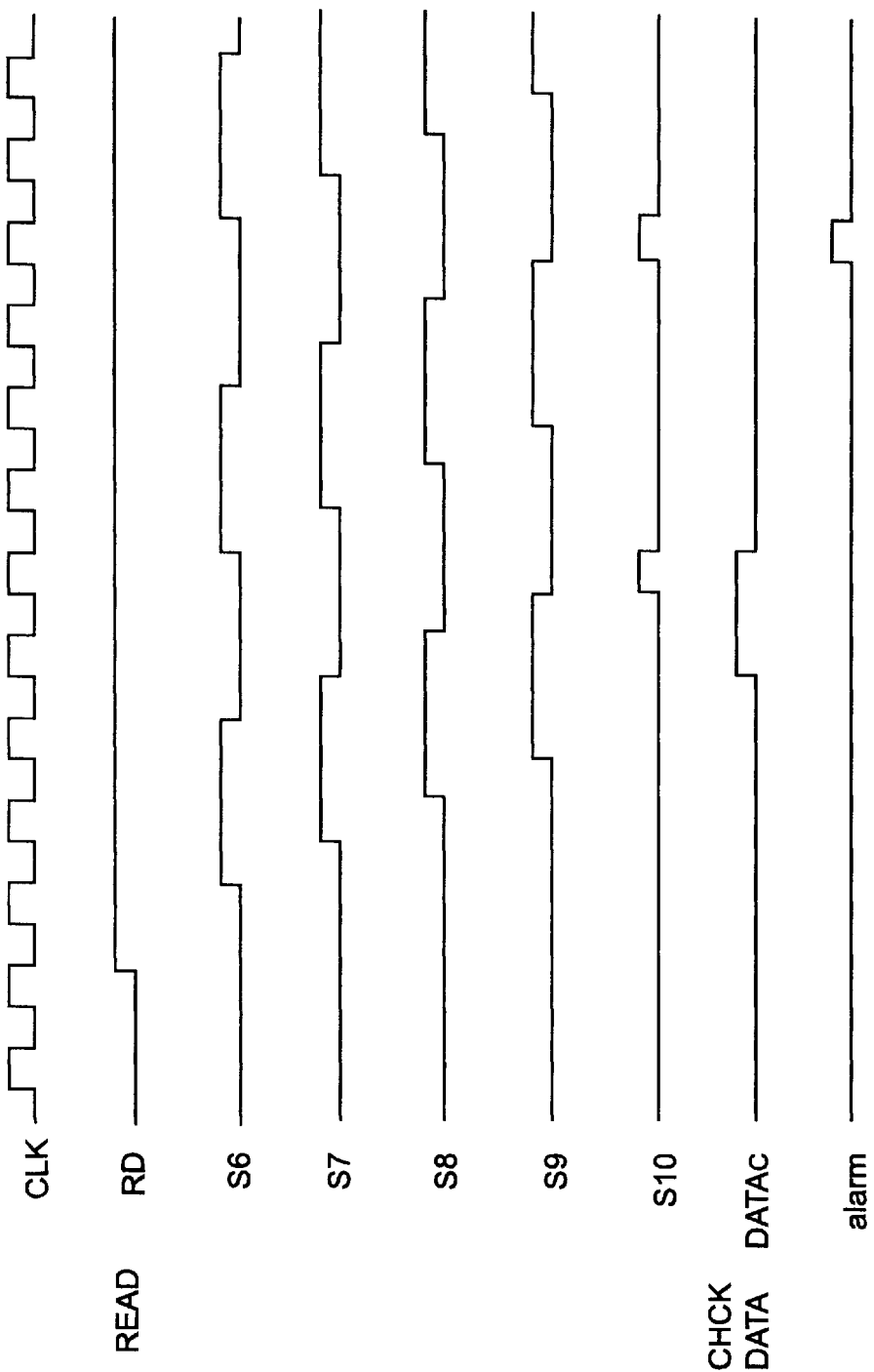
FIG. 6 is a timing waveform chart showing an operation of the data comparing circuit as shown in FIG. 5.

Referring to FIG. 6, the signal S6 is always 0 when the read signal RD is 0, and is equivalent to the pre-charge signal PR when the read signal RD is 1. Since the signals S7, S8 and S9 are delayed half clock periods from each other, the signal S9 delayed one and half clock periods as obtained resultantly and the pre-charge signal PR are inputted to the NAND gate 417. In this way, the check timing of the check data DATAc read from the check memory cell is adjusted according to the output signal S10 of the NAND gate 417. In the case where the check data DATAc has not been normally read from the check memory cell, the alarm signal is changed from 0 to 1.

In this way, simultaneously when the erasing/writing operation is conducted on the memory cell array 10, writing operation is conducted on the check memory array 20 in a more severe condition. The check data DATAc held in the check memory cell is confirmed at the time of reading operation with the result that the termination of the lifetime can be presumed before the memory cell array 10 does not get normally operated.

SECOND EMBODIMENT

A second embodiment of the present invention will be described with reference to FIG. 7, where circuit elements similar to those previously described with reference to FIG. 1 are denoted by the same reference numerals and their descriptions are omitted.

Figure 7:
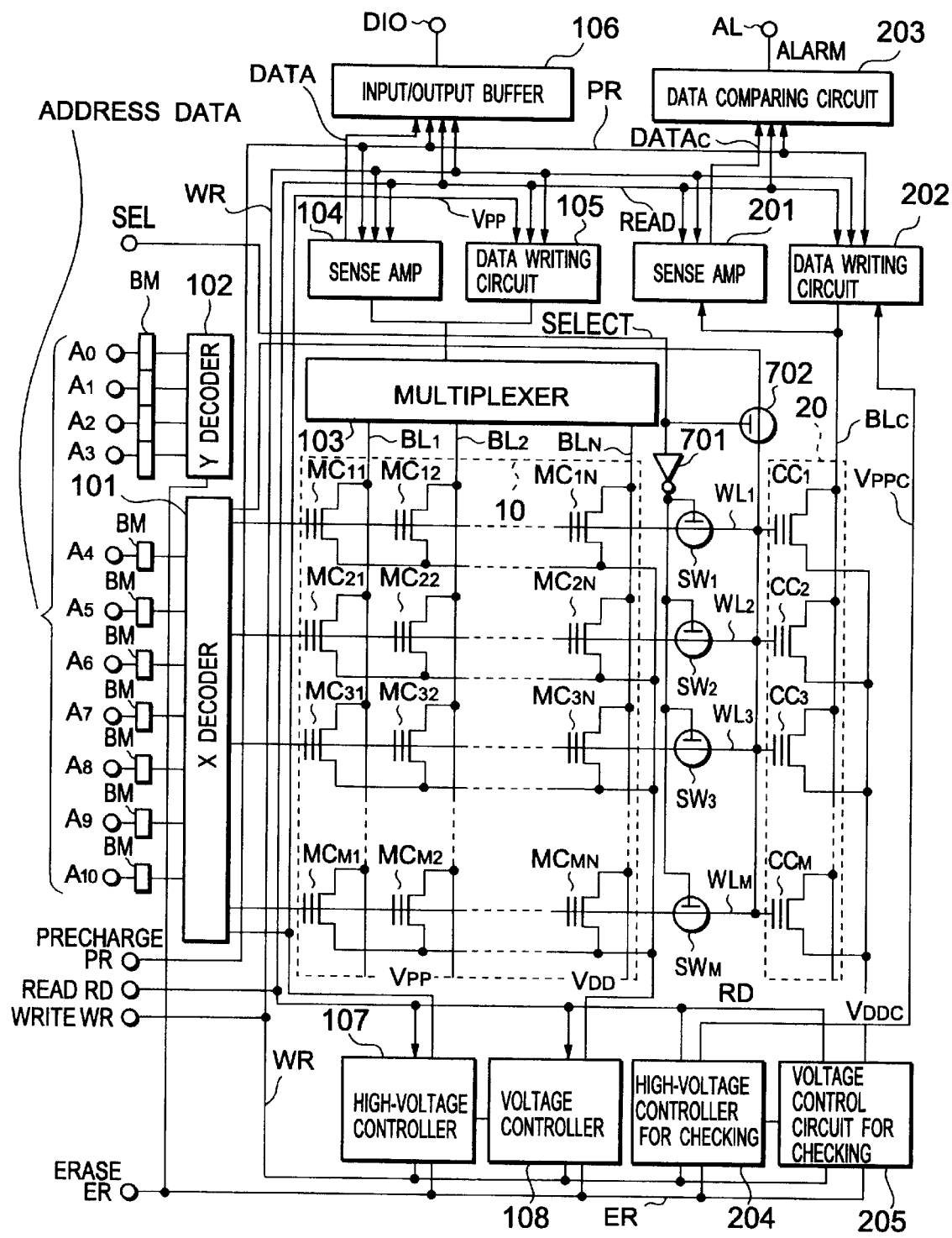
FIG. 7 is a circuit diagram showing a second embodiment of the present invention.
Figure 8A:
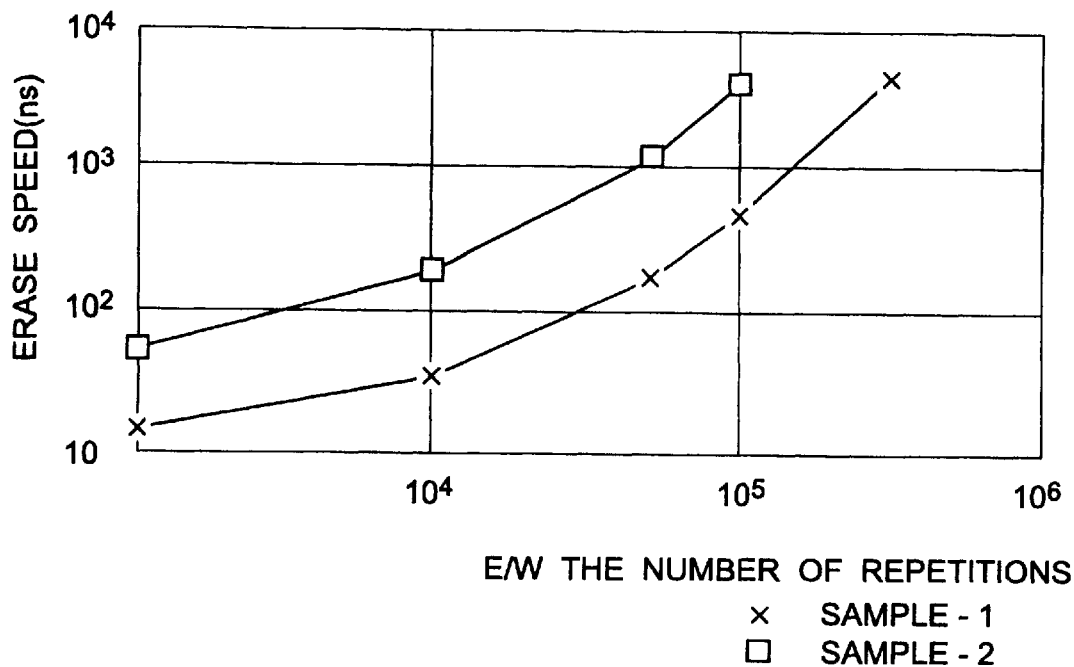
Figure 8B:
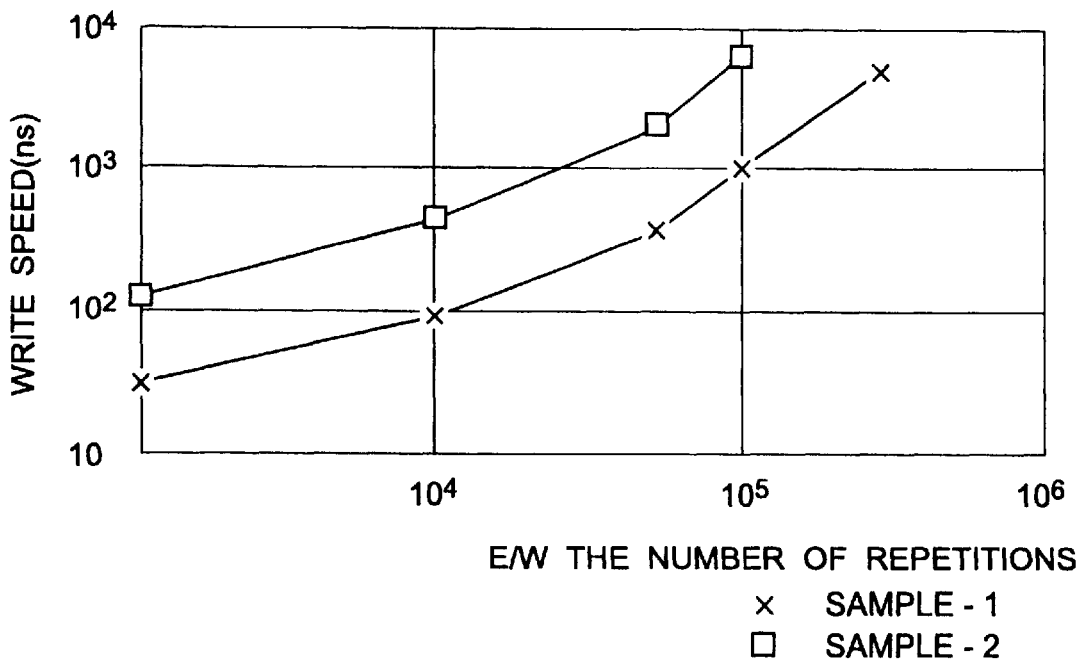

Referring to FIG. 7, M switching transistors $SW_1$–$SW_M$ are inserted between the memory cell array 10 and the check memory cell array 20 on the word lines $WL_1$–$WL_M$, respectively. A selection signal SEL is inverted by an inverter 701 and the inverted selection signal is applied in common to the gates of the switching transistors $SW_1$–$SW_M$. The selection signal SEL is also applied to the gate of a switching transistor 702 which is used to apply an erasing/writing voltage to the control gates of the check memory cells $CC_1$–$CC_M$ when the switching transistors $SW_1$–$SW_M$ are in off state.

In this embodiment, the number of times of using the check memory array 20 can be set to made more than the number of times of using the memory array 10 in advance. For example, the erasing/writing operation is conducted on the check memory array 20 about 5,000 times before the memory cell array 10 starts to be used so that the check memory array 20 is brought in a state where it is in advance more deteriorated than the memory array 10. Even in the case where the erasing/writing period of time for the check memory array 20 is made completely identical with that for the memory array 10, the same effect is obtained.

As described above, a first advantage of the present invention resides in that the memory device can be used in suitability with the characteristics of the respective memory cells in comparison with the conventional method in which the number of time of writing operation is fixed. The reason is stated below. Every time the erasing/writing operation is conducted on the memory array 10, the corresponding check memory cell is erased, and the value 1 is always written therein. Therefore, because the deteriorated state of the check memory cell is equal to the worst deteriorated state of the memory cell, or the check memory cell is more deteriorated than the memory cell, the deterioration state of the corresponding cell block can be judged by detecting the data stored in the check memory cell.

A second advantage of the present invention resides in that the number of surplus memories as required is reduced. In the case of preparing the memory as a counter as in the conventional device, ten-odd bits are required for each block. According to the present invention, however, it is sufficient to provide one memory cell for each block.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A nonvolatile memory device comprising:
    a first nonvolatile memory element that is electrically writable;
    a second nonvolatile memory element that is electrically writable and has about the same characteristic as the first nonvolatile memory element;
    a memory controller for controlling a write/read operation of the second nonvolatile memory element such that a predetermined value is written to the second nonvolatile memory element each time a write operation is performed in the first nonvolatile memory element; and
    a comparator for comparing a value stored in the second nonvolatile memory element to the predetermined value,
    wherein data is written to the first nonvolatile memory element by a first write operation and the predetermined value is written to the second nonvolatile memory element by a second write operation, wherein the first and second write operations include an erase phase and a write phase which are sequentially placed within a predetermined time period, wherein a time period of the write phase of the second write operation is shorter than that of the first write operation.

2. The nonvolatile memory device according to claim 1, wherein a time period of the erase phase of the second write operation is longer than that of the first write operation.

3. A nonvolatile memory device comprising:

a first nonvolatile memory element that is electrically writable;

a second nonvolatile memory element that is electrically writable and has about the same characteristic as the first nonvolatile memory element;

a memory controller for controlling a write/read operation of the second nonvolatile memory element such that a predetermined value is written to the second nonvolatile memory element each time a write operation is performed in the first nonvolatile memory element; and a comparator for comparing a value stored in the second nonvolatile memory element to the predetermined value, wherein data is written to the first nonvolatile memory element by a first write operation and the predetermined value is written to the second nonvolatile memory element by a second write operation, wherein the first and second write operations include an erase phase and a write phase which are sequentially placed within a predetermined time period, wherein a time period of the write phase of the second write operation is as long as that of the first write operation.

4. A nonvolatile memory device comprising:

a first memory cell array including a predetermined number of cell blocks each including a plurality of first nonvolatile memory cells each being electrically writable;

a second memory cell array including the predetermined number of second nonvolatile memory cells each of which is electrically writable and has about the same characteristic as the first nonvolatile memory cell, wherein the second nonvolatile memory cells correspond to the cell blocks, respectively;

a first memory controller for controlling a write/read operation of a designated cell block of the first memory cell array;

a second memory controller for controlling a write/read operation of a second nonvolatile memory cell corresponding to the designated cell block such that a predetermined value is written to the second nonvolatile memory cell each time a write operation is performed in the designated cell block; and a comparator for comparing a value stored in the second nonvolatile memory cell to the predetermined value, wherein the first memory controller controls such that data is written to the designated cell block by a first write operation, and the second memory controller controls such that the predetermined value is written to the second nonvolatile memory cell by a second write operation, wherein the first and second write operations include an erase phase and a write phase which are sequentially placed within a predetermined time period, and wherein a time period of the write phase of the second write operation is shorter than that of the first write operation.

5. The nonvolatile memory device according to claim 4, wherein a time period of the erase phase of the second write operation is longer than that of the first write operation.

6. A nonvolatile memory device comprising:

a first memory cell array including a predetermined number of cell blocks each including a plurality of first nonvolatile memory cells each being electrically writable;

a second memory cell array including the predetermined number of second nonvolatile memory cells each of which is electrically writable and has about the same characteristic as the first nonvolatile memory cell, wherein the second nonvolatile memory cells correspond to the cell blocks, respectively;

a first memory controller for controlling a write/read operation of a designated cell block of the first memory cell array;

a second memory controller for controlling a write/read operation of a second nonvolatile memory cell corresponding to the designated cell block such that a predetermined value is written to the second nonvolatile memory cell each time a write operation is performed in the designated cell block; and a comparator for comparing a value stored in the second nonvolatile memory cell to the predetermined value, wherein the first memory controller controls such that data is written to the designated cell block by a first write operation, and the second memory controller controls such that the predetermined value is written to the second nonvolatile memory cell by a second write operation, wherein the first and second write operations include an erase phase and a write phase which are sequentially placed within a predetermined time period, and wherein a time period of the write phase of the second write operation is as long as that of the first write operation.

7. A nonvolatile memory device comprising:

a first memory cell array including a predetermined number of cell blocks each including a plurality of first nonvolatile memory cells each being electrically writable;

a second memory cell array including the predetermined number of second nonvolatile memory cells each of which is electrically writable and has about the same characteristic as the first nonvolatile memory cell, wherein the second nonvolatile memory cells correspond to the cell blocks, respectively;

a first memory controller for controlling a write/read operation of a designated cell block of the first memory cell array;

a second memory controller for controlling a write/read operation of a second nonvolatile memory cell corresponding to the designated cell block such that a predetermined value is written to the second nonvolatile memory cell each time a write operation is performed in the designated cell block;

a comparator for comparing a value stored in the second nonvolatile memory cell to the predetermined value;

a third memory controller performing the write operation of the second memory cell array a predetermined number of times before the write operation is performed in the first memory cell array; and a switch for electrically separating the second memory cell array from the first memory cell array under control of the third memory controller when the write operation of the second memory cell array is performed a predetermined number of times before the write operation is performed in the first memory cell array.

8. A method for detecting a deterioration state of a first nonvolatile memory element that is electrically writable, comprising:

performing a write/read operation of a second nonvolatile memory element that is electrically writable and has about the same characteristic as the first nonvolatile memory element such that a predetermined value is written to the second nonvolatile memory element each time a write operation is performed in the first nonvolatile memory element;

determining whether a value stored in the second nonvolatile memory element coincides with the predetermined value; and detecting the deterioration state of the first nonvolatile memory element when the value stored in the second nonvolatile memory element does not coincide with the predetermined value, wherein data is written to the first nonvolatile memory element by a first write operation and the predetermined value is written to the second nonvolatile memory element by a second write operation, wherein the first and second write operations include an erase phase and a write phase which are sequentially placed within a predetermined time period, and wherein the time period of the write phase of the second write operation is shorter than that of the first write operation.

9. The method according to claim 8, wherein a time period of the erase phase of the second write operation is longer than that of the first write operation.

10. A method for detecting a deterioration state of a first nonvolatile memory clement that is electrically writable, comprising:

performing a write/read operation of a second nonvolatile memory element that is electrically writable and has about the same characteristic as the first nonvolatile memory element such that a predetermined value is written to the second nonvolatile memory element each time a write operation is performed in the first nonvolatile memory element;

determining whether a value stored in the second nonvolatile memory element coincides with the predetermined value; and detecting the deterioration state of the first nonvolatile memory element when the value stored in the second nonvolatile memory element does not coincide with the predetermined value, wherein data is written to the first nonvolatile memory element by a first write operation and the predetermined value is written to the second nonvolatile memory element by a second write operation, wherein the first and second write operations include an erase phase and a write phase which are sequentially placed within a predetermined time period, and wherein a time period of the write phase of the second write operation is as long as that of the first write operation.

* * * * *